United States Patent [19]
Kobayashi et al.

[11] Patent Number: 5,311,402
[45] Date of Patent: May 10, 1994

[54] SEMICONDUCTOR DEVICE PACKAGE HAVING LOCATING MECHANISM FOR PROPERLY POSITIONING SEMICONDUCTOR DEVICE WITHIN PACKAGE

[75] Inventors: Kenzi Kobayashi; Hajime Mori; Yukio Yamaguti, all of Tokyo, Japan

[73] Assignee: NEC Corporation, Tokyo, Japan

[21] Appl. No.: 16,938

[22] Filed: Feb. 12, 1993

[30] Foreign Application Priority Data

Feb. 14, 1992 [JP] Japan .................................. 4-059246
Mar. 17, 1992 [JP] Japan .................................. 4-090166
Apr. 6, 1992 [JP] Japan .................................. 4-112398

[51] Int. Cl.⁵ .................................................. H05K 7/02
[52] U.S. Cl. .................................. 361/760; 361/707; 361/748; 361/784; 361/807; 174/17.05; 174/52.4; 174/259; 257/686; 257/779; 439/65
[58] Field of Search .............. 361/388, 397, 399, 400, 361/401, 412, 413, 417, 420, 8, 707, 748, 752, 760, 761, 784, 785, 807, 813; 174/52.4, 17.05, 255, 259; 257/678, 686, 779, 723; 439/69, 65, 67, 71, 72

[56] References Cited

U.S. PATENT DOCUMENTS

| | | | |
|---|---|---|---|
| 4,949,224 | 8/1990 | Yamamura et al. | 361/412 |
| 5,013,871 | 5/1991 | Mahulikar et al. | 174/52.4 |
| 5,132,875 | 7/1992 | Plesinger | 361/386 |
| 5,136,469 | 8/1992 | Carusillo et al. | 361/397 |

*Primary Examiner*—Leo P. Picard
*Assistant Examiner*—Young Whang
*Attorney, Agent, or Firm*—Sughrue, Mion, Zinn, Macpeak & Seas

[57] ABSTRACT

A semiconductor device having an IC (Integrated Circuit) chip packaged on a circuit board, and a cap for hermetically sealing the chip. The cap is bonded to the circuit board at the edges of an open end thereof and bonded to the chip at the underside or bottom thereof. To accurately position the chip on the circuit board, the circuit board is provided with a groove or a shoulder in a position where it faces the edges of the open end of the cap. After the chip has been positioned on the circuit board, the cap is bonded to the circuit board via the groove or the shoulder.

8 Claims, 7 Drawing Sheets

SEMICONDUCTOR DEVICE PACKAGE HAVING LOCATING MECHANISM FOR PROPERLY POSITIONING SEMICONDUCTOR DEVICE WITHIN PACKAGE

BACKGROUND OF THE INVENTION

The present invention relates to a semiconductor device having an IC (Integrated Circuit) chip and a cap hermetically sealing the IC chip.

Semiconductor devices of the kind described include one disclosed in IEICE TRANSACTIONS, VOL. E74, NO. 8 August 1991, page 2333, FIG. 2. The semiconductor device taught in this document has a TAB (Tape Automated Bonding) IC chip provided with TAB leads. The IC chip is packaged on a circuit board face down via a buffer implemented by silicone rubber and is connected to the board via the TAB leads. A cap is seam-welded to the circuit board along the edges of the open end thereof and is bonded to the top of the chip at the bottom or underside thereof, thereby hermetically sealing the chip. The silicone rubber intervening between the chip and the circuit board absorbs irregularity in the height and inclination of the chip when the chip is packaged on the circuit board. Specifically, the silicone rubber maintains the thickness of bond between the cap and the chip constant. However, when it comes to flip chip packaging for producing signals from the entire surface of an IC chip via bumps or micropin packaging for doing so via input/output micropins, it is not practicable to protect the bonding portion by silicon rubber or similar elastic material from below the chip. The flip chip packaging scheme and micropin packaging scheme are essential in coping with the increasing number of signals associated with an IC chip.

To eliminate the above problem, the IC chip may be bonded to solder bumps provided on a thin film formed on the circuit board and hermetically sealed by the cap, as proposed in the 41st ECTC Papers, 1991, page 704, FIG. 1. To absorb the irregularity in the configuration of the cap and the irregularity in the packaging height of the chip, a cap having prescribed dimensions is selected after the packaging of the chip, or the thickness of the solder is changed. Therefore, this type of semiconductor device is not practicable unless different kinds of caps are prepared beforehand, resulting in the increase in cost and the decrease in yield.

Further, when the irregularity in the height of the semiconductor device and the irregularity in the packaging height of the chip are not adjusted, there also occurs irregularities in the thickness of the adhesive for bonding the chip and cap, i.e., the adhesive intervening between the top of the chip and the bottom of the cap. For example, as the adhesive becomes thick, the thermal resistance from the chip or heat source to the top of the cap, i.e., a heat radiation surface increases to degrade the cooling effect. Moreover, the increase in the thickness of the adhesive makes it difficult to remove voids from the adhesive. This also increases the thermal resistance and causes cracks to occur due to thermal stresses, degrading the reliability and quality. In addition, when the cap and circuit board are soldered to each other, the solder is apt to fly apart onto the signal leads and circuit board in the event of connection. It is likely that this part of the solder melts due to heat in the event of repair to short-circuit the portions where the chip and circuit board are connected.

SUMMARY OF THE INVENTION

It is, therefore, an object of the present invention to provide a semiconductor device which is free from the problems particular to the conventional devices as discussed above.

It semiconductor device of the present invention comprises a circuit board, an IC chip packaged on the circuit board face down, a cap bonded to the circuit board at the edges of an open end thereof and bonded to the top of the IC chip at the bottom thereof for hermetically sealing the IC chip, and positioning means for positioning the IC chip on the circuit board.

BRIEF DESCRIPTION OF THE DRAWINGS

The above and other objects, features and advantages of the present invention will become more apparent from the following detailed description taken with accompanying drawings in which.

DESCRIPTION OF THE PREFERRED EMBODIMENTS

Figure 1:
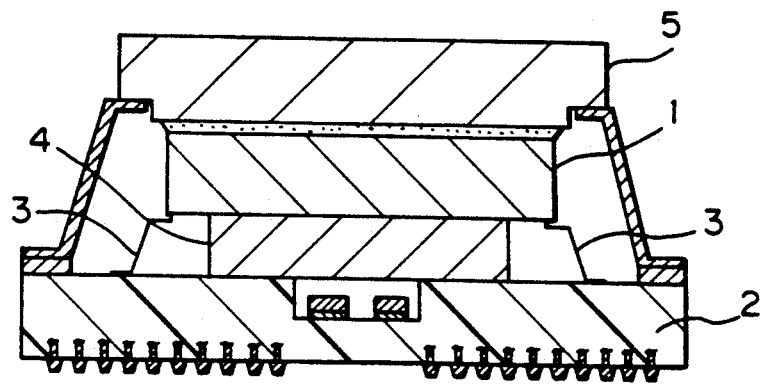
FIG. 1 is a section of conventional semiconductor device.

To better understand the present invention, a brief reference will be made to a prior art semiconductor device disclosed in IEICE TRANSACTIONS, VOL. E.74, NO. 8 August 1991, page 2333, shown in FIG. 1. As shown, an IC chip 1 has TAB leads 3 and is positioned on a circuit board 2 face down. The chip 1 is connected to the circuit board 2 via the TAB leads 3. Silicone rubber 4 is interposed between the chip 1 and the circuit board 2 as a buffer. A cap 5 is seam-welded to the circuit board 2 along the edges of the open end thereof, thereby hermetically sealing the chip 1. The bottom or underside of the cap 5 is connected to the top of the chip 1 by an adhesive.

The silicone rubber 4 intervening between the chip 1 and the circuit board 2 absorbs the irregularity in the height and inclination of the chip 1 when the chip 1 is packaged on the circuit board 2. Specifically, the silicone rubber 4 maintains the thickness of bond between the cap 5 and the chip 1 constant. However, when it comes to flip chip packaging for producing signals from the entire surface of an IC chip via bumps or micropin packaging for doing so via input/output micropins, it is not practicable to protect the connecting portion by silicon rubber or similar elastic material from below the chip. The flip chip packaging scheme and micropin packaging scheme are essential in coping with the increasing number of signals associated with an IC chip.

Figure 2:
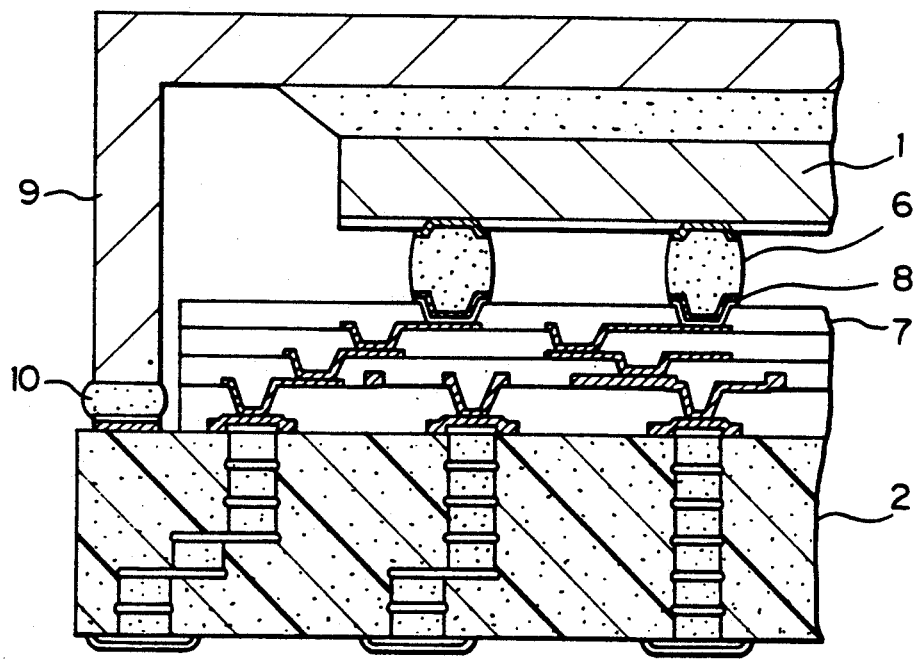
FIG. 2 is a fragmentary enlarged section of another conventional semiconductor device implemented with flip chip packaging.

FIG. 2 shows a flip chip packaging type semiconductor device disclosed in the 41st ECTC Papers, 1991, page 704. As shown, an IC chip 1 is connected by solder bumps 6 to pads 8 provided on a thin film 7 which is formed on a circuit board 2. A cap 9 is made of AlN and connected to the circuit board 2 by a solder 10 so as to hermetically seal the chip 1. To absorb the irregularity in the configuration of the cap 9 and the irregularity in the packaging height of the chip 1, a cap 9 having prescribed dimensions is selected after the packaging of the chip 1, or the thickness of the solder 10 is changed. Therefore, this type of semiconductor device is not practicable without resorting to some different kinds of caps 9, resulting in the increase in cost and the decrease in yield.

Figure 3:
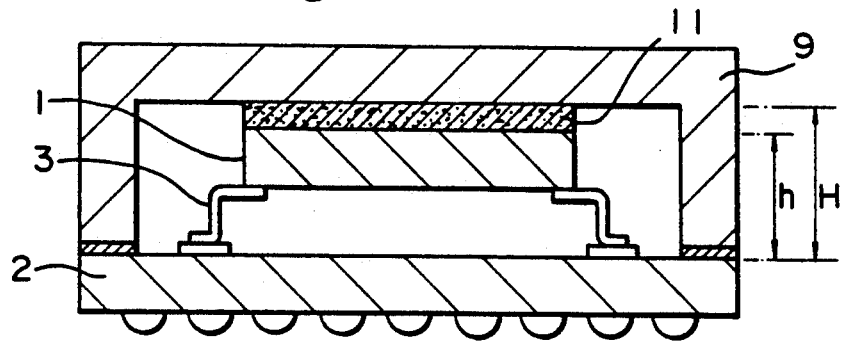
FIG. 3 is a fragmentary enlarged section of another conventional semiconductor device in which the dimensions of a cap are not changed.

FIG. 3 shows a conventional semiconductor device in which the dimensions of the cap 1 are not changed. As shown, when the height of the cap 9 and the packaging height of the IC chip 1 are not adjusted, the irregularity in height H as measured from the circuit board 2 to the bottom or underside of the cap 9 is about ±0.03 millimeter while the irregularity in height h to the top of the chip 1 is ±0.05 millimeter. Hence, assuming that the minimum thickness of an adhesive 11 connecting the chip 1 and cap 9 is 0.03 millimeter, then the thickness of the adhesive 11 varies over a range of from 0.03 millimeter to 0.21 millimeter. Another problem is that as the adhesive 11 becomes thick, the thermal resistance from the chip or heat source 1 to the top of the cap 9, i.e., a heat radiation surface increases to degrade the cooling effect. Moreover, the increase in the thickness of the adhesive 11 makes it difficult to remove voids from the adhesive. This also increases the thermal resistance and causes cracks to occur due to thermal stresses, degrading the reliability and quality.

In addition, when the cap 9 and circuit board 2 are soldered to each other, the solder is apt to fly apart onto the signal leads and circuit board 2 in the event of connection. It is likely that this part of the solder melts due to heat in the event of repair to short-circuit the portions where the chip 1 and circuit board 2 are connected.

Preferred embodiments of the semiconductor device in accordance with the present invention will be described which eliminate the problems discussed above.

1st Embodiment

Figure 4:
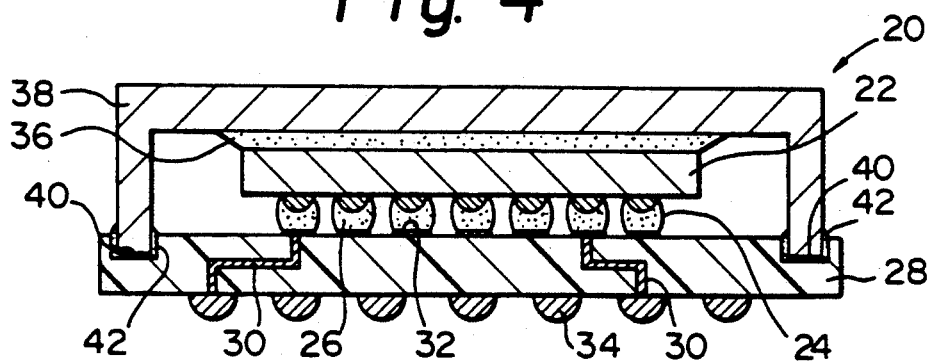
FIG. 4 is a section showing a first embodiment of the semiconductor device in accordance with the present invention.
Figure 5:
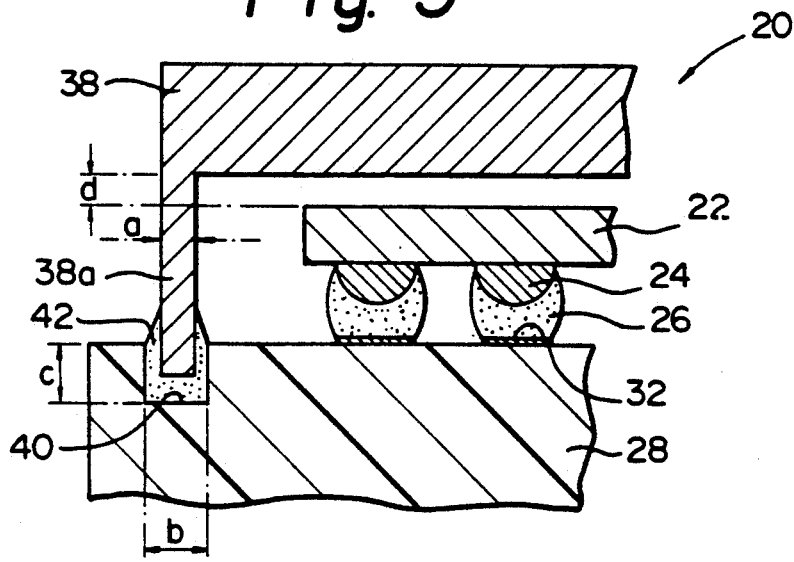
FIG. 5 is a fragmentary enlarged section of the embodiment.

Referring to FIGS. 4 and 5, a semiconductor device embodying the present invention is shown and generally designated by the reference numeral 20. As shown, the device 20 has an IC chip 22 provided with connection terminals in the form of bumps 24. The chip 22 is laid on a circuit board 28 face down and has the bumps 24 connected to the board 28 by a solder 26. The circuit board 28 has W, Ag-P or similar conductive wirings 30 thereinside and pads 32 on the front surface thereof. The pads 32 are electrically connected to the bumps 24 of the chip 22. Connection terminals 34 are provided on the rear surface of the circuit board 28 to be connected to an MLS (Multi-Layer Substrate) or similar substrate, not shown. The top of the chip 20 is connected to the bottom or underside of a cap 38 by an adhesive 36. The circuit board 28 is formed with a continuous groove 40 which the entire edges of the open end of the cap 38 face. A solder 42 is filled in the groove 40. As a result, the cap 38 is soldered to the circuit board 28 with the edges of the open end thereof received in the groove 42, thereby hermetically sealing the chip 22. In the illustrative embodiment, the cap 38 is made of Cu/W, AlN or similar substance having a high heat radiation ability and provided with a bottomed rectangular configuration. The adhesive 36 is implemented by, for example, 80 Au/20 Sn solder which has high thermal conductivity.

As shown in FIG. 5, assume that the side walls 38a of the cap 38 have a thickness a of 0.2 millimeter. Then, the groove 40 should preferably have a width b of 0.3 millimeter and a depth c of 0.3 millimeter. The depth c is selected to be greater than the gap d between the cap 38 and the chip 22.

The chip 22 is packaged on the circuit board 28 by having the bumps 24 thereof connected to the pads 32 by the solder 26. At this instant, the thickness of the chip 22, the amount of the solder 26 and the shape and dimensions of the bumps 24 are irregular. This causes the chip 22 to incline on the circuit board 28 and, therefore, brings about irregularities in the height thereof. In addition, the dimensions of the cap 38 are irregular. In the illustrative embodiment, the solder 42 is filled in the groove 40 to form a pool. Hence, in the event when the cap 38 is put over the chip 22 for hermetic sealing, the amount in which the cap 38 is received in the solder pool can be changed to absorb the above-mentioned irregularities as well as the irregularity in the depth of the cap 38.

The embodiment, therefore, forms a uniform narrow gap between the chip 22 and the cap 38. This gap is uniformly filled with the adhesive 36. As a result, the increase in the thermal resistance from the chip or heat source 22 to the top of the cap 38, i.e., a heat radiation surface is eliminated. Further, the occurrence of voids in the adhesive 36 and defective bond are eliminated.

To assemble the semiconductor device 20, the chip 22 is soldered to the circuit board 28 by an Au/Sn or similar high-temperature solder, and then the cap 38 is soldered to the board 28 by an Sn/Pb eutectic solder. Consequently, the chip 22 is hermetically sealed by the cap 38. The resulting chip carrier is packaged on an MLS or similar substrate, not shown. Specifically, the connection terminals 34 are soldered to an MLS or similar substrate by an In-based solder having a low melting point.

Figure 6:
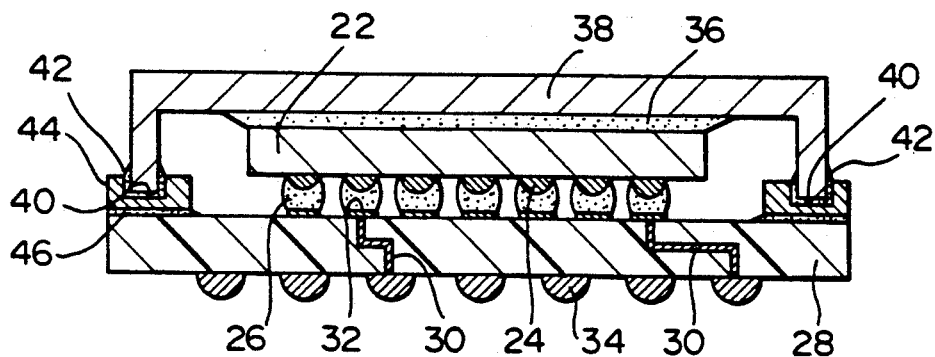
FIGS. 6-8 are sections each showing a modified form of the embodiment.

FIG. 6 shows a modified form of the semiconductor device 20. As shown, the groove 40 directly formed in the circuit board 28 is replaced with a frame 44 affixed to the board 28. Specifically, the frame 44 is implemented as a metallic frame having a hollow square shape, seen in a plan view. The groove 40 is continuously formed in the hollow square upper surface of the frame 44. The frame 44 is affixed to part of the circuit board 28 which will face the edges of the open end of the cap 38 by, for example, a silver solder 46. The solder 42 is filled in the groove 40 to form a pool. With the frame 44, it is needless for the circuit board 28 to be machined. The modification of FIG. 6 may advantageously be used when it is difficult to form the groove 40 in the circuit board 28.

Figure 7:
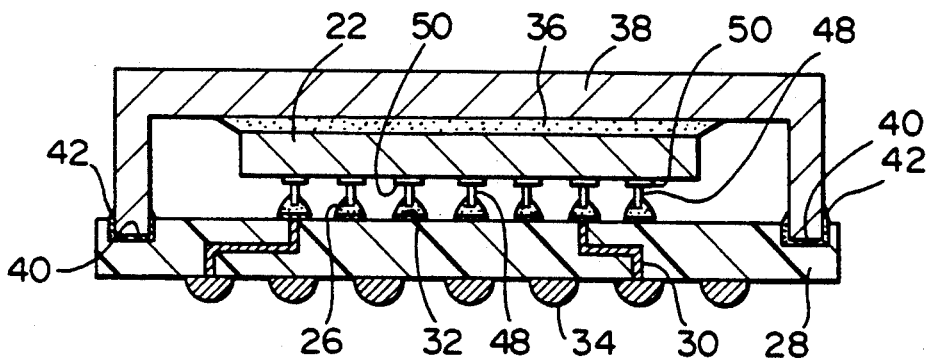
Figure 8:
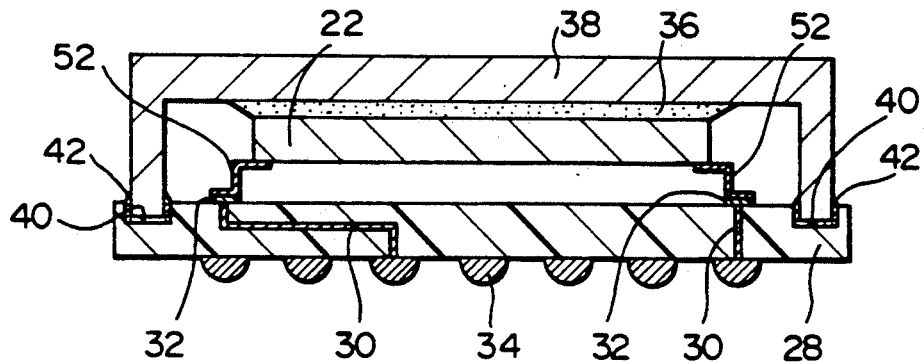

In the embodiment of FIGS. 4 and 5 and the modification of FIG. 6, the bumps 24 are used to package the chip 22 face down. Alternatively, the bumps 24 may be replaced with micropins 48 shown in FIG. 7 or with TAB leads 52 shown in FIG. 8. Specifically, in FIG. 7, the micropins 48 are studded on surface electrodes 50 provided on the chip 22 at one end and connected to the pads 32 of the circuit board 28 at the other end by the solder 26. The micropins 48 may have a diameter of 0.1 millimeter and a length of 2 millimeter by way of example. When the micropins 48 are used to package the chip 22 on the circuit board 28, the difference in the coefficient of thermal expansion between the chip 22 and the circuit board 28 is absorbed. This allows the chip 22 to be packaged on various kinds of circuit boards 28, i.e., chip carriers. Here, the chip 22 will have a coefficient of thermal expansion of 3/°C. when implemented by Si while the circuit board 28 will have a coefficient of thermal expansion of 6.7/°C. when implemented by $Al_2O_3$. On the other hand, in FIG. 8, the chip 22 is packaged on the circuit board 28 by having the TAB leads 52 thereof connected to the pads 32 of the board 28 by, for example, Au—Au thermocompression bonding). At this instant, the chip 22 packaged on the circuit board 28 changes in height or inclines due to the irregularity in the thickness of the chip 22 itself and in the configuration of the leads 52. It has been customary to absorb such irregularities by the silicone rubber 4, FIG. 1, intervening between the chip 1 and the circuit board 2. In the modification shown in FIG. 8, it is the solder pool provided on the circuit board 28 that allows the chip 22 to be hermetically sealed and absorbs the irregularities. This eliminates the need for the conventional silicone rubber 4.

As described above, in the first embodiment and modifications thereof, a circuit board has a continuous groove in part thereof which the edges of the open end of a cap face, and the edges of the open end are affixed in the groove by a solder. Since the depth to which the edges of the open end of the cap is received, i.e., the distance between an IC chip and the cap can be changed, the irregularity in the packaging height and inclination of the chip and the irregularity in the depth of the cap are absorbed. This insures a uniform gap between the chip and the cap and, therefore, promotes easy management of the amount of an adhesive to be filled in the gap. Consequently, the adhesive is free from bubbles and defective bond. This, coupled with high heat conductivity, enhances the reliability of a chip carrier.

2nd Embodiment

Figure 9:
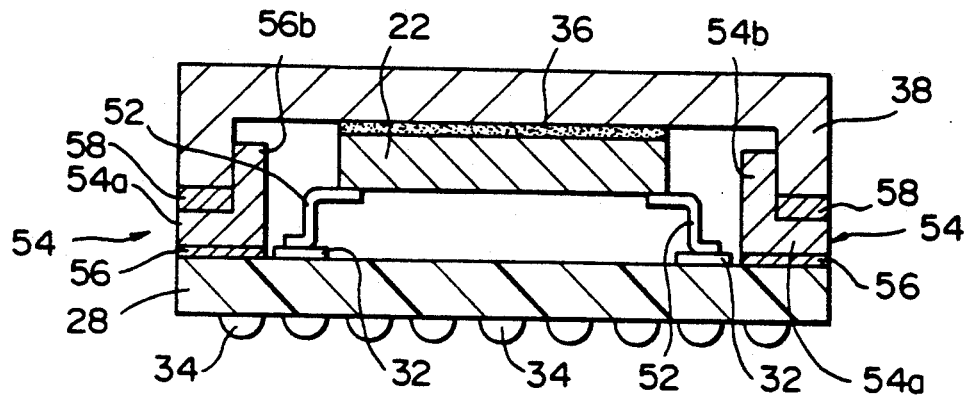
FIG. 9 is a section showing a second embodiment of the semiconductor device in accordance with the present invention.

Referring to FIG. 9, an alternative embodiment of the present invention will be described. In this embodiment, the same or similar constituents as or to those of the first embodiment are designated by the same reference numerals, and a detailed description will not be made to avoid redundancy. As shown, to package the chip 22 on the circuit board 28 face down, the TAB leads 52 are connected to the pads 32 provided on the circuit board 28 by Au—Au thermocompression bonding. The chip 22 is hermetically sealed by the cap 38 and a height adjusting frame 54 which will be described. It is to be noted that the circuit board 28 is provided with the bumps 34 to be connected to a substrate, not shown. Supporting the cap 38, the height adjusting frame 54 is made of alumina ceramics and provided with a hollow square configuration, as seen in a plan view. The frame 54 has a cross-section in the form of a letter L constituted by a flange 54a and a cap guide 54b. The square opening of the frame 54 has a width great enough to allow the chip 22 and TAB leads 52 to be received therein. The cap guide 54b located at the inside of the flange 54a extends away from the circuit board 28 and has an outside diameter allowing the cap 38 to be coupled over the cap guide 54b. The frame 54 is bonded to the circuit board 28 via a seal material 56 while accommodating the chip 22 therein.

The frame 54 may be made of AlN, SiC, Kobar or Cu/W alloy in place of the above-mentioned material. Also, the seal material 56 may be made of various kinds of solders including epoxy resin, Sn/Pb solder, Au/Sn, Au/Si, Au/Ge and Ag solders.

The edges of the open end of the cap 38 are bonded to the flange 54a of the frame 54 via a seal material 58. The inner surface or bottom of the cap 38 is connected to the top of the chip 22 by the adhesive 36. When the cap 38 is bonded to the frame 54, the cap guide 54b of the cap 54 is received in the open end of the cap 38. While the seal material 58 is, in principle, identical with the seal material 56 in composition, the former may be different from the latter, depending on bonding conditions, i.e., equipment. For example, use may be made of an 80Au/20Sn solder. The adhesive 36 is selected from a group of adhesives having high heat conductivity; for example, Epotech B9028 available from Epotech or an Sn/Pb solder paste is applied in a predetermined thin layer by a template printing technology. In the above structure, when the cap 38 is coupled over the frame 54, it is movable up and down along the cap guide 54b. Hence, even when the height from the circuit board 28 to the top of the chip 22 or the height of the cap 38 is irregular, the cap 38 can be surely bonded to the frame 54 at a position where the bottom of the cap 38 closely contacts the top of the chip 22 via the adhesive 36.

Assume that the height from the circuit board 28 to the top of the chip 22 is $0.8\pm0.05$ millimeter, that the height from the edges of the open end of the cap 38 to the bottom of the same is $0.3\pm0.05$ millimeter, that the frame 54 is $0.2\pm0.05$ millimeter thick and $0.4\pm0.5$ millimeter high, and that the seal materials 56 and 58 are each 0.01 millimeter to 0.05 millimeter thick. Then, the bottom of the cap 38 can move at least over 0.55 millimeter to 1.0 millimeter while the thickness of the adhesive 36 is selectable in a range of from 0 millimeter to 0.15 millimeter. It follows that the cap 38 and frame 54 can be bonded with an accuracy of $0.01\pm0.005$ millimeter if an adequate method is used for supplying the adhesive 36.

As stated above, since the cap 38 is movable up and down along the cap guide 54b of the frame 54 to change the gap between the chip 22 and the cap 38, a single kind of caps 38 suffice in providing the adhesive 26 with a predetermined thickness. While the embodiment packages the chip 22 on the circuit board 28 face down by the TAB system, the TAB system may be replaced with the flip chip system or the micropin system, as will be described hereinafter.

Figure 10:
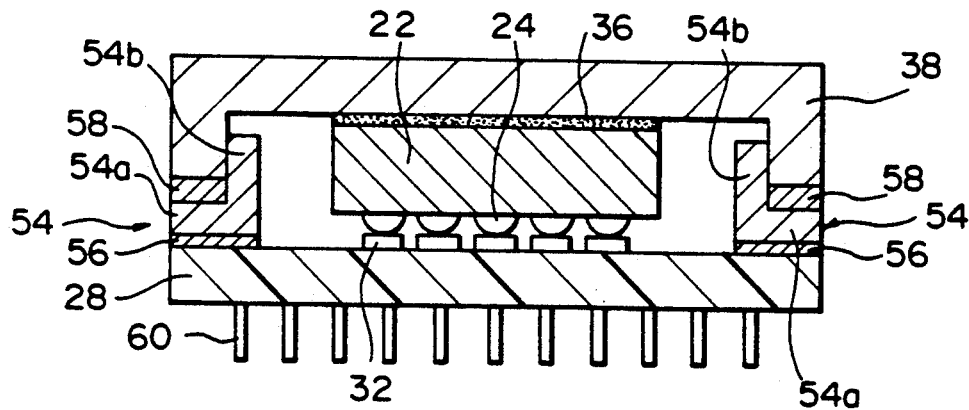
FIGS. 10-14 are sections each showing a modified form of the second embodiment.

In a modification shown in FIG. 10, the chip 22 is provided with the bumps 24 (e.g. 10Sn/90Pb or 80Au/20Sn). The bumps 24 are bonded to the pads 32 of the circuit board 28 to package the chip 22 on the board 28. Micropins 60 are provided on the circuit board 28 in place of the bumps 34, FIG. 9.

Figure 11:
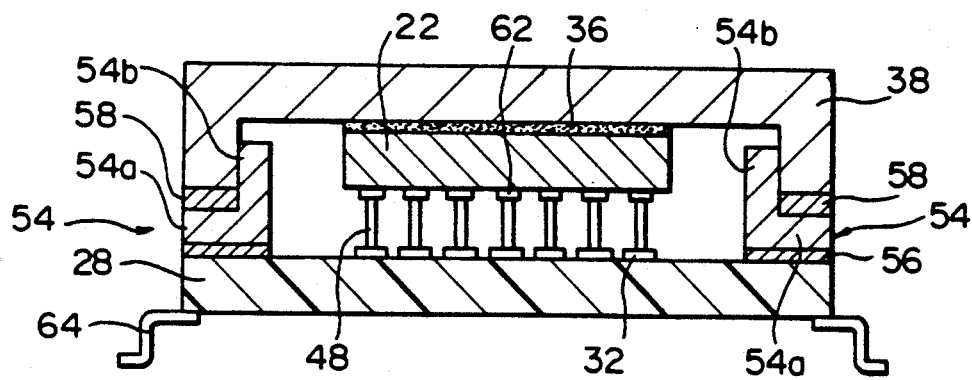

In another modification shown in FIG. 11, the micropins 48 are studded on the chip 22 at one end and bonded to the pads 32 of the circuit board 28 at the other end. Specifically, the lower end of each micropin 48 is bonded to one of the pads 32 by a high temperature solder (e.g. 10Sn/90Pb or 80Au/20Sn) while the upper end thereof is bonded to one of pads 62 provided on the chip 22 by a higher temperature solder (e.g. Cd/Ag or Zn/Al). The cap 38 is connected to the circuit board 28 via the frame 54. Further, leads 64 resembling gull wings are provided on the circuit board 28 in place of the bumps 34, FIG. 9.

The modifications of FIGS. 10 and 11 are comparable with the embodiment of FIG. 9 in respect of advantages. It is to be noted that the bumps 34, micropins 60 and leads 64 may be combined in any desired configuration. In the embodiment of FIG. 9 or the modification of FIG. 11, the TAB leads 52 or the micropins 48 reduce thermal stresses ascribable to the difference in the coefficient of thermal expansion between the chip 22 and the circuit board 28. This allows the circuit board 28 to be implemented by alumina ceramics or similar material which differs from silicone in the coefficient of thermal expansion. In the flip chip system shown in FIG. 10, a material whose coefficient of thermal expansion matches the size of the chip 22 has to be selected.

Figure 12:
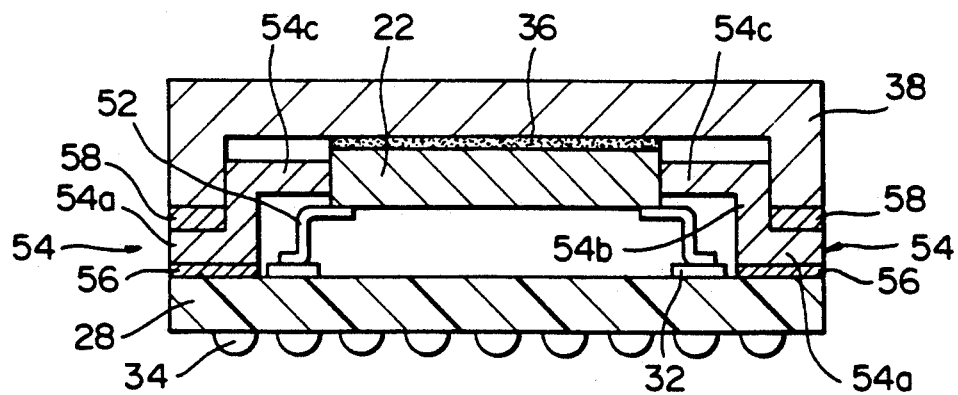

FIG. 12 shows another modification of the second embodiment. As shown, the frame 54 is provided with a step-like cross-section made up of the flange 54a, the cap guide 54b and a partition 54c. The partition 54c protrudes from the end of the cap guide 54b into the opening as far as a position where it adjoins the four sides of the chip 22. When the frame 54 having such a configuration is connected to the circuit board 28 on which the chip 22 is packaged, the partition 54c adjoins the four sides of the chip 22 and divides the space around the chip 22 into an upper space and a lower space. Assume that the adhesive 36 for bonding the bottom of the cap 38 and the top of the chip 22 is conductive and low in viscosity (e.g. Sn/Pb solder). Then, when the cap 38 is bonded to the frame 54, the adhesive 36 is prevented from flying apart or flowing to reach the portions where the chip 22 and circuit board 28 are connected. In this connection, the adhesive 36 would fly apart if replaced with a solder or would flow if replaced with an epoxy adhesive with an Ag filler.

Figure 13:
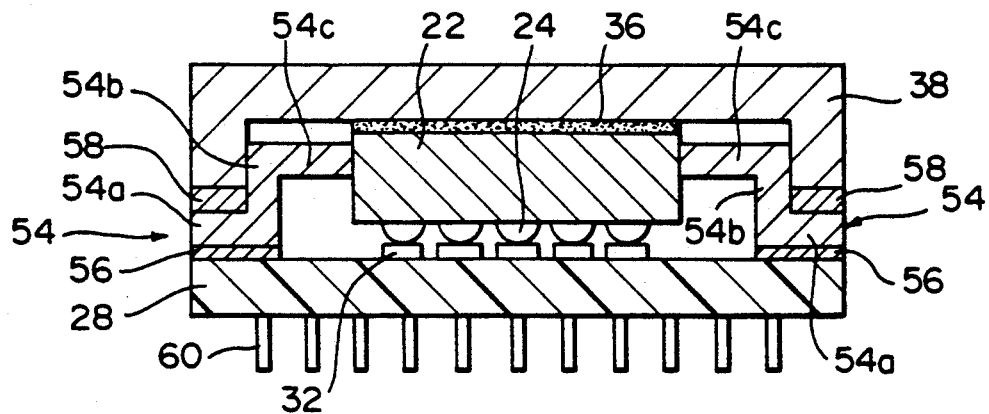

Still another modification is shown in FIG. 13 and uses the flip chip system. As shown, the high temperature solder bumps 24 are provided on the chip 22 and bonded to the pads 32 of the circuit board 28 to package the chip 22 on the board 28. The micropins 60 are provided on the circuit board 28 in place of the bumps 34 shown in FIG. 12.

Figure 14:
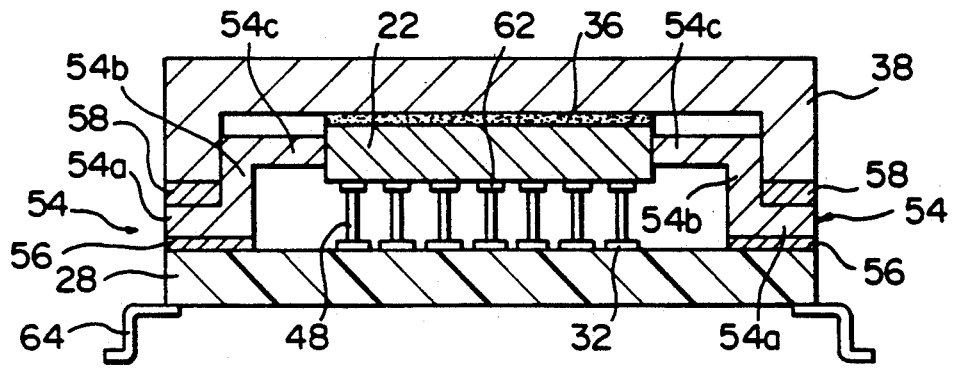

A further modification is shown in FIG. 14 and uses micropins. As shown, the micropins 48 are provided on the chip 22 and bonded to the pads 32 of the circuit board 28 at the lower ends thereof. The cap 38 is connected to the circuit board 28 via the frame 54. The leads 64 resembling gull wings are provided on the circuit board 28 in place of the bumps 34 shown in FIG. 12.

The modifications shown in FIGS. 13 and 14 are comparable with the modification of FIG. 12 in respect of advantages.

As stated above, in the second embodiment and modifications thereof, a frame capable of accommodating an IC chip in an opening thereof is interposed between a circuit board and the edges of the open end of a cap. The cap is coupled over a cap guide which extends from the frame away from the circuit board. The cap is, therefore, movable up and down along the cap guide to change the gap between it and the chip. This allows the chip and cap to be bonded together by an adhesive of predetermined small thickness even though the packaging height of the chip and the height of the cap may be irregular. As a result, the thermal resistance from the chip to the top of the cap is reduced to enhance the cooling efficiency. This, coupled with the fact that voids in the adhesive can be easily removed, improves the reliability and quality of the product. Further, a partition protrudes from the frame to the vicinity of the sides of the chip so as to isolate the chip packaging portion from the portion where the chip and cap are connected. Hence, the partition prevents an adhesive for bonding the chip and cap from entering the chip packaging portion. This further improves the reliability and quality of the product and, in addition, increases the yield.

3rd Embodiment

Figure 15:
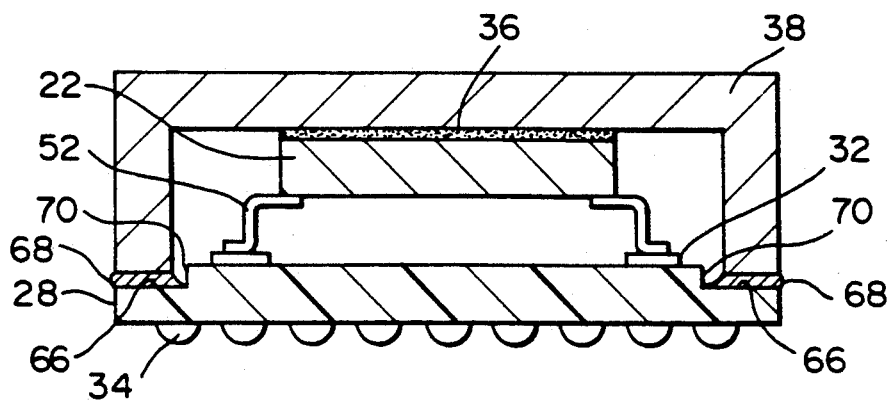
FIG. 15 is a section showing a third embodiment of the semiconductor device in accordance with the present invention.

Referring to FIG. 15, a third embodiment of the present invention will be described. In this embodiment, the same or similar constituents as or to those of the first and second embodiments and modifications thereof are designated by the same reference numerals, and a detailed description will not be made to avoid redundancy. As shown, the IC chip 22 is packaged on the circuit board 28 face down with the TAB leads 52 connected to the pads 32 of the circuit board 28 by Au—Au thermocompression bonding. The chip 22 is hermetically sealed by the cap 38. The bumps 34 are provided on the circuit board 28 for connecting the semiconductor device to a substrate, not shown. A shoulder 66 is formed on the circuit board 28 around the chip packaging portion and is in level than the surface where the pads 32 are located. The edges of the open end of the cap 38 are bonded to the shoulder 66 by a seal material 68 so as to hermetically seal the chip 22. The chip 22 is bonded to the bottom of the cap 38 by the adhesive 36. The adhesive 36 has high heat conductivity and may be comprised of Epotech B9022 or B9028 available from Epotech, epoxy adhesive of H35-175M or Sn/Pb solder paste. The adhesive 35 is supplied to the top of the chip 22 in a thin constant layer by, for example, template printing. Further, the cap 38 is made of a material having heat conductivity high enough to cool the chip 22 and, in addition, having a coefficient of thermal expansion as close to that of silicone as possible (e.g. AlN). The seal material 68 for bonding the cap 38 to the circuit board 28 may also be implemented by the adhesive 36 or may be made of any other material matching particular conditions including equipment.

To assemble the semiconductor device, the chip 22 is packaged on the circuit board 22, and then the cap 38 is mounted to hermetically seal the chip 22. The cap 38 is bonded to the circuit board 28 by the seal material 68 and to the chip 22 by the adhesive 36. At this instant, the cap 38 is movable up and down along the sides 70 derived from the shoulder 66. Therefore, the cap 38 can be surely fixed in place at a position where the bottom of the cap 38 closely contacts the top of the chip 22 via the adhesive 36 although the height from the circuit board 28 to the top of the chip 22 may be irregular or the chip 22 itself may be inclined.

For example, assume that the height of the chip 22 as measured from the circuit board 28 is $0.7\pm0.04$ millimeter, that the height from the edges of the open end of the cap 38 to the bottom of the cap 48 is $0.9\pm0.04$ millimeter, and that the adhesive 36 is 0.02±0.01 millimeter thick. Then, if the shoulder 66 is about 0.35±0.03 millimeter deep as measured from the top of the circuit board 28, the cap 38 can approach the shoulder 66 over a range of from 0.08 millimeter to 0.27 millimeter as measured from the top of the board 28. The seal material 68 is received in a gap of 0.05 millimeter to 0.3 millimeter between the cap 38 and the shoulder 66. In this manner, the gap between the chip 22 and the cap 38 changes with the distance between the edges of the open end of the cap 38 and the shoulder 66, absorbing the irregularities in the packing height and inclination of the chip 38.

When the cap 38 is bonded to the circuit board 28, the seal material 68 for bonding the edges of the cap 38 to the board 28 may flow out sideways. However, since the cap 38 is bonded to the circuit board 28 on the shoulder 66 which is positioned at lower level than the pads 32, the seal material 68 is preventing from reaching the chip packaging portion when implemented by a solder.

While the embodiment uses the TAB system in packaging the chip 22 on the circuit board 28 face down, the TAB system may be replaced with the flip chip system or the micropin system, as follows.

Figure 16:
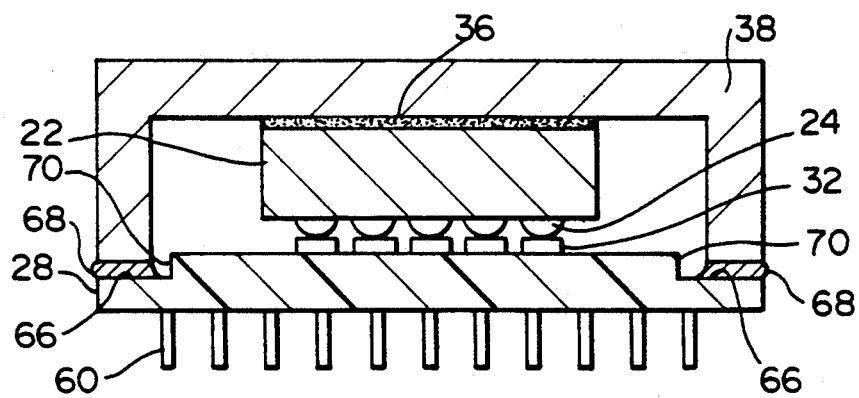
FIGS. 16-20 are sections each showing a modified form of the third embodiment.

Specifically, FIG. 16 shows a modification of the embodiment which uses the flip chip system. As shown, the high temperature solder bumps 24 (e.g. 10Sn/90Pb or 80Au/20Sn) are provided on the chip 22 and bonded to the pads 32 provided on the circuit board 28, thereby packaging the chip 22 on the board 28. The micropins 60 are provided on the circuit board 28 in place of the bumps 34 shown in FIG. 15.

Figure 17:
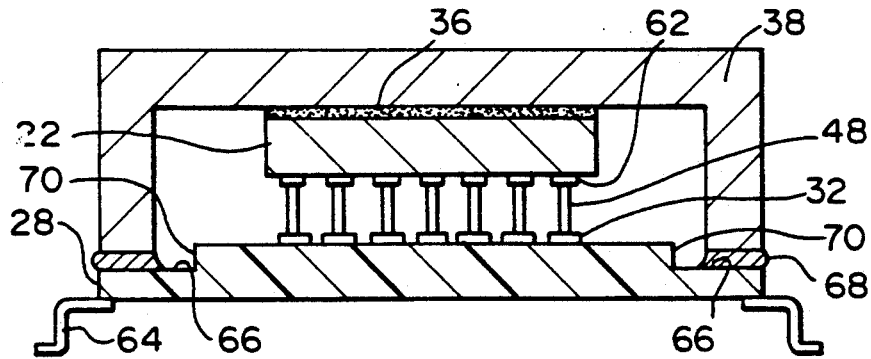

FIG. 17 shows another modification in which the micropins 48 are provided on the chip 22 and bonded to the pads 32 of the circuit board 28 at the lower ends thereof. As a result, the chip 22 is packaged on the circuit board 28. Specifically, the lower ends of the micropin 48 are bonded to the pads 32 by a high temperature solder (e.g. 10Sn/90Pb or 80Au/20Sn) while the upper ends thereof are bonded to the pads 62 of the chip 22 by a higher temperature solder (e.g. Cd/Ag or Zn/Al). The leads 64 resembling gull wings are provided on the circuit board 28 in place of the bumps 34 shown in FIG. 15.

The modifications of FIGS. 16 and 17 are comparable with the embodiment of FIG. 15 in respect of advantages. It is to be noted that the bumps 34, micropins 60 and leads 64 may be provided on the circuit board 28 in any desirable combination. In the embodiment of FIG. 15 or the modification of FIG. 17, the TAB leads 52 or the micropins 48 reduce thermal stresses ascribable to the difference in the coefficient of thermal expansion between the chip 22 and the circuit board 28. This allows the circuit board 28 to be implemented by alumina ceramics or similar material which differs from silicone in the coefficient of thermal expansion. In the flip chip system shown in FIG. 16, a material whose coefficient of thermal expansion matches the size of the chip 22 has to be selected. While the embodiment and modifications thereof described above provide a gap between the sides 70 contiguous with the shoulder 66 and the inner periphery of the cap 38, the cap 38 may contact the sides 70, as will be described with reference to FIGS. 18-20.

Figure 18:
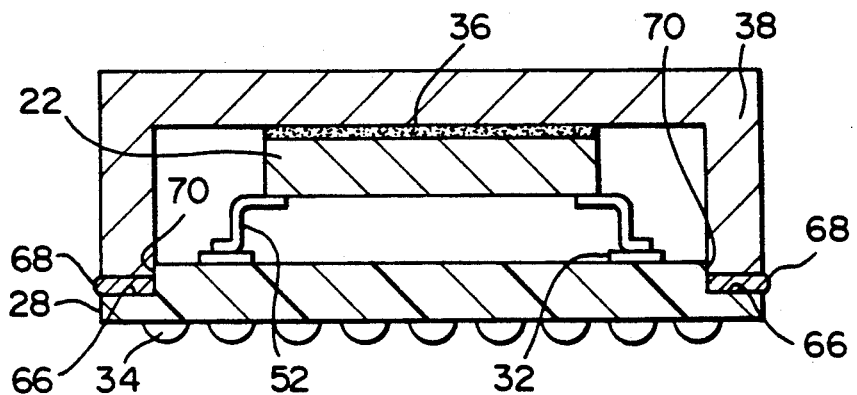
Figure 19:
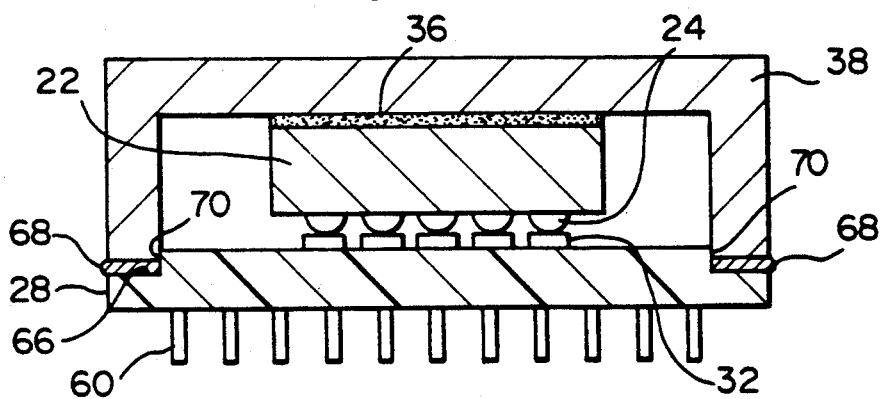
Figure 20:
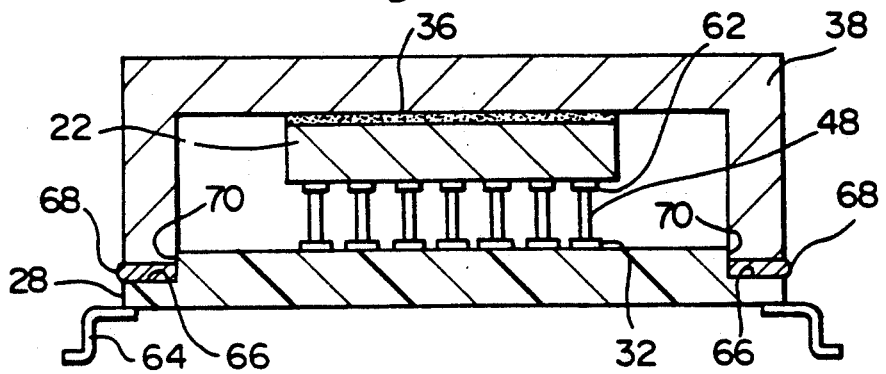

FIGS. 18-20 show respectively a semiconductor device having the chip 22 packaged by the TAB system, a semiconductor device having the chip 22 packaged by the flip chip system, and a semiconductor device having the chip 22 packaged by the micropin system. In these modifications, the shoulder 66 is also located at a lower level than the surface of the circuit board 28 where the pads 32 are positioned. In these modifications, the position where the shoulder 66 is located is changed relative to the circuit board 28. Specifically, the shoulder 66 is positioned such that the inner periphery of the cap 38 contacts the sides 70 of the circuit board 28. Assume that the seal material 68 is implemented by a conductive material having low viscosity (e.g. Sn/Pb solder). Then, the sides 70 and the cap 38 contacting each other will prevent the seal material 68 from flying apart, flowing or melting to reach the portions where the chip 22 and board 28 are connected when the cap 38 is bonded. This is successful in enhancing the reliability and quality of the product as well as the yield thereof. Of course, the modifications of FIGS. 18-20 also achieve the advantages described in relation to the previous modifications.

As stated above, in the third embodiment and modifications thereof, part of a circuit board surrounding an IC chip packaging portion is positioned at a lower level than the other part where pads are arranged, and the edges of the open end of a cap are bonded to the lowered part via a seal material. Hence, the gap between the chip and the cap changes with a change in the gap between the edges of the open end of the cap and the lowered part, thereby absorbing irregularities in the packaging height and inclination of the chip. Specifically, although the packaging height of the chip and the height of the cap may be irregular, an adhesive for bonding the cap to the chip can be provided with a predetermined thickness despite the use of a single kind of caps. This makes it needless to produce a particular kind of caps for each of the products, thereby lowering the cost. Furthermore, the thermal resistance from the chip to the top of the cap is reduced to increase the cooling efficiency to a considerable degree. In addition, voids can be easily removed from the adhesive. Consequently, the semiconductor device has high reliability and high quality.

Various modifications will become possible for those skilled in the art after receiving the teachings of the present disclosure without departing from the scope thereof.

What is claimed is:

1. A semiconductor device comprising:
   a circuit board; an IC (Integrated Circuit) chip packaged on said circuit board face down;
   a cap bonded to said circuit board at edges of an open end thereof and bonded to a top of said IC chip at a bottom thereof for hermetically sealing said IC chip; and
   positioning means for positioning said IC chip on said circuit board, wherein said positioning means comprises a continuous groove provided in part of said circuit board facing said edges of said open end of said cap for receiving said edges, and a bonding material filled in said continuous groove for bonding said edges to said circuit board.

2. The semiconductor device as claimed in claim 1, wherein said continuous groove is formed such that all of said edges of said open end of said cap face said continuous groove.

3. The semiconductor device as claimed in claim 2, wherein said bonding material comprises a solder.

4. The semiconductor device as claimed in claim 1, wherein said continuous groove is directly formed in said circuit board.

5. The semiconductor device as claimed in claim 1, wherein said continuous groove is formed in a metallic frame provided on said circuit board.

6. A semiconductor device comprising:

a circuit board;

an IC (Integrated Circuit) chip packaged on said circuit board face down;

a cap bonded to said circuit board at edges of an open end thereof and bonded to a top of said IC chip at a bottom thereof for hermetically sealing said IC chip; and positioning means for positioning said IC chip on said circuit board, wherein said positioning means comprises a frame intervening between said circuit board and said cap, said frame comprising a guide portion extending away from said circuit board and guiding said edges of said cap while engaging with said edges.

7. The semiconductor device as claimed in claim 6, wherein said frame further comprises a partition extending from an end of said guide portion into said open end of said cap for isolating an adhesive which bonds said cap to said IC chip.

8. A semiconductor device comprising:

a circuit board;

an IC (Integrated Circuit) chip packaged on said circuit board face down;

a cap bonded to said circuit board at edges of an open end thereof and bonded to a top of said IC chip at a bottom thereof for hermetically sealing said IC chip; and positioning means for positioning said IC chip on said circuit board, wherein said positioning means comprises a shoulder formed by lowering part of said circuit board facing said edges of said open end of said cap, and a seal material for bonding said edges to said circuit board at said shoulder.

* * * * *